United States Patent [19]

Sundström

[11] 3,931,635

[45] Jan. 6, 1976

[54] SEMICONDUCTOR DEVICE WITH A CONTROL ELECTRODE IN PRESSURE CONTACT WITH THE SEMICONDUCTOR DISC

[75] Inventor: Dan Sundström, Vasteras, Sweden

[73] Assignee: Allmanna Svenska Elektriska Aktiebolaget, Vasteras, Sweden

[22] Filed: May 7, 1974

[21] Appl. No.: 467,677

[30] Foreign Application Priority Data
June 12, 1973 Sweden .................... 7308216

[52] U.S. Cl. .................................. 357/79; 357/75
[51] Int. Cl.² ................ H01L 23/42; H01L 23/44
[58] Field of Search .................... 357/79, 75

[56] References Cited
UNITED STATES PATENTS

| | | | |
|---|---|---|---|
| 3,437,887 | 4/1969 | Nowalk et al. | 357/79 |
| 3,536,966 | 10/1970 | Lewis | 357/79 |
| 3,599,057 | 10/1971 | Lootens | 357/79 |
| 3,673,308 | 6/1972 | Juchmann et al. | 357/79 |

FOREIGN PATENTS OR APPLICATIONS

| | | | |
|---|---|---|---|
| 1,064,522 | 4/1967 | United Kingdom | 357/79 |
| 474,818 | 2/1968 | Japan | 357/79 |

Primary Examiner—Andrew J. James

[57] ABSTRACT

A semiconductor device is formed of a box having a bottom and a lid, formed of metallic material and each maintaining an electrical contact with one side of the semiconductor disc. The bottom and lid are each connected to a ring of insulating material. A metal ring is positioned between and secured to the rings of insulating material. A control electrode is secured at its ends to the metal ring and extends substantially diametrically thereacross. The control electrode has a projecting contact part which is in engagement with one side of the semiconductor disc and is of such height as to be held by the control electrode in pressure contact with such side.

3 Claims, 8 Drawing Figures

SEMICONDUCTOR DEVICE WITH A CONTROL ELECTRODE IN PRESSURE CONTACT WITH THE SEMICONDUCTOR DISC

BACKGROUND OF THE INVENTION

1. Field of the Invention

The invention relates to a semiconductor device composed of thyristors with a control electrode.

2. The Prior Art

In semiconductor devices the semiconductor disc, usually of silicon, with support plates, if any, applied thereon, of molybdenum or some other material having approximately the same coefficient of thermal expansion as the semiconductor disc, is normally hermetically enclosed in a box. A known box for this purpose consists of a bottom and a lid of metallic material in electrical contact with the respective side of the semiconductor disc, and of two rings of ceramic material arranged one after the other in the current direction of the semiconductor. The two rings are fixed to each other by two flanges of metallic material. Each flange is fixed to one of the rings of ceramic material, and the flanges are further directly joined to each other. If the semiconductor device is designed as a thyristor, the control electrode in the form of a wire can be fixed to the metal flanges and to the point on the silicon disc where it is to make contact. The flanges thereby act as terminals for the control electrode.

For application of a control electrode to a semiconductor disc, two fundamentally different methods are used. According to one method the control electrode is fixed to the semiconductor disc by soldering, alloying or welding. According to the other method the control electrode is held pressed against the semiconductor disc by a spring force, the semiconductor disc normally having a contact surface which is prepared in advance.

SUMMARY OF THE INVENTION

The present invention relates to the latter method of applying the control electrode. It is characteristic of the invention that the contact between the control electrode and the semiconductor disc is very effective and safe. It is also very simple. It may be manufactured in one single and robust piece and its use eliminates problems with internal joints and problems with separate members for generating the spring pressure.

More particularly, the present invention relates to a semiconductor device consisting of a thyristor with a control electrode the semiconductor disc of which is enclosed in a box comprising a bottom and a lid of metallic material, which are in electrical contact with one side each of the semiconductor disc, and two rings of insulating material, preferably ceramic material, arranged one after the other in the current direction of the semiconductor device, said rings being fixed to each other over a metal ring to which the control electrode is connected, characterised in that the control electrode extends across the box and is anchored in two sections of the metal ring which are at least substantially diametrically positioned in relation to each other, and that the control electrode for effecting contact with the semiconductor disc is provided with a projecting contact part of such a height that the contact part is held pressed against the semiconductor disc merely through the anchoring of the control electrode in the metal ring. In the form shown, the projecting contact part is of such a height that the control electode is slightly deformed away from the disc when it is applied thereon, so as to press resiliently against the disc.

According to a preferred embodiment of the invention, the metal ring and the control electrode consist of one single piece punched out from sheet-metal.

BRIEF DESCRIPTION OF THE DRAWINGS

The invention will be explained more fully by way of example with reference to the accompanying drawing, in which FIG. 3 shows the part in a view from above.

DESCRIPTION OF THE PREFERRED EMBODIMENTS

Figure 1:
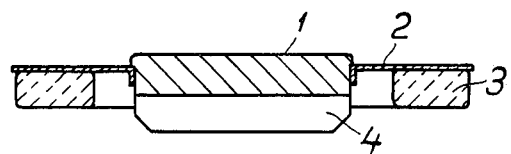
FIGS. 1–4 show different parts of a semiconductor device according to the invention prior to the final assembly.

FIG. 1 shows, on the one hand, the lid of the box which consists of a centrally located relatively thick disc 1 of copper and of a relatively thin ring 2, fixed to said disc, of metallic material such as copper, iron, iron-nickel alloy or iron-nickel-cobalt alloy, and, on the other hand, the ring 3 of insulating material such as ceramic material, such as porcelain, located nearest the lid. The disc 1 and the ring 2 are fixed to each other by brazing with, for example, silver solder, and ring 2 and ring 3 are fixed to each other by brazing with, for example, silver solder or gluing, as with an epoxy resin glue. The disc 1 has a diametrically running slot 4 in order to make possible the application of the control electrode with its contact part, as will be clear later on.

Figure 2:
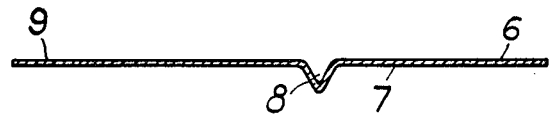
Figure 3:
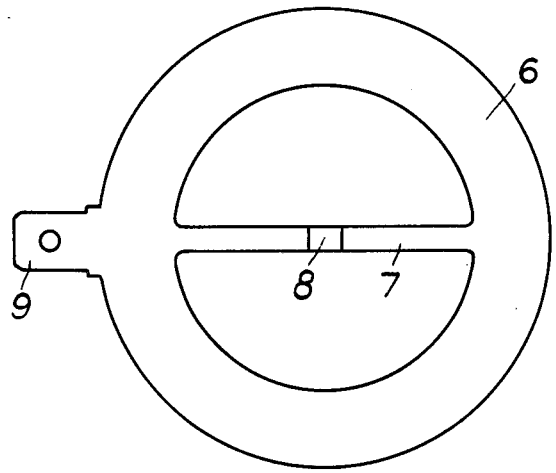

FIGS. 2 and 3 show the metal ring 6 which is intended to be placed between the rings of insulating material which form the box, with a control electrode 7 anchored to the box. The control electrode is provided with a projecting contact part 8 intended to effect contact with the semiconductor disc of the semiconductor device. The ring 6 is further provided with a projecting part 9 acting as a terminal for the control electrode.

In the case shown, the parts 6–9 consist of one integral piece, punched out from sheet-metal of the material used, the part 8 being suitably pressed out during cold flow of the material after the punching. It is advantageous if at least the parts 6 and 7 are made from one single, integral piece of sheet-metal. The parts 8 and 9 may be fixed to the parts 7 and 6, respectively, afterwards, for example by soldering or welding. Suitable materials for the parts 6–9 are phosphor bronze, iron-nickel alloy or iron-nickel-cobalt alloy.

Figure 4:
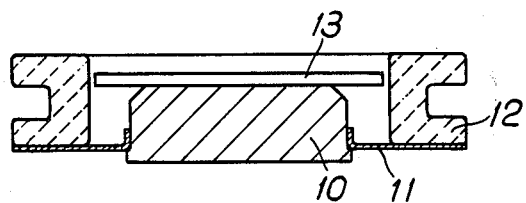

FIG. 4 shows, on the one hand, the lid of the box which consists of a centrally located, relatively thick disc 10 of copper and of a relatively thin ring 11, fixed to said disc, of the same material as the ring 2, and on the other hand the ring 12 of the same material as in the ring 3, which ring 12 is located nearest the bottom. The parts 10 and 11 are fixed to each other in the same way as the parts 1 and 2 and the parts 11 and 12 in the same way as the parts 2 and 3. On top of the disc 10 a round silicon disc 13 is placed without being soldered or otherwise secured to the disc 10. The silicon disc is of the p-n-p type and arranged for a central gate terminal. The silicon disc may have a support plate of molybdenum or the like on one side or on both sides. If such a support plate is arranged on the upper side, it is provided with a hole passing through its center, through which the contact part 8 of the control electrode may effect contact with the silicon disc.

Figure 5:
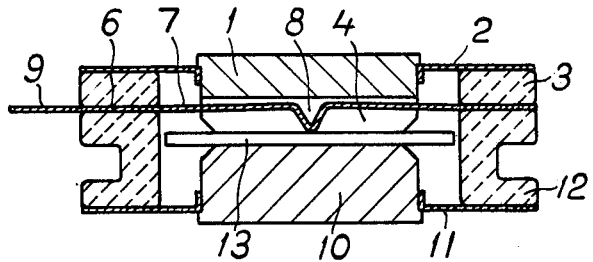
FIG. 5 shows a semiconductor device according to the invention composed of the parts shown in FIGS. 1–4, FIGS. 6 and 7 show different parts in another semiconductor device according to the invention prior to the final assemblage

The parts shown in FIGS. 1–4 are joined, by brazing or gluing of the metal ring 6, first to ring 3 of insulating material and then to ring 12 of insulating material, in this way forming a semiconductor device according to FIG. 5. Because of the fact that the contact part 8 has a height greater than the vertical distance between the upper surface of the ring 12 and the upper surface of the semiconductor disc 13 and because of the attachment of the metal ring 6 in the rings 3 and 12 of insulating material, the contact part is effectively pressed against the semiconductor disc by the spring force thus arising.

The control electrode 7 is suitably surrounded by an insulating material within the part located in the slot 4, for example, by a plastic foil such as a polyetheneglycol terephthalate foil, in order to prevent contact between the electrode and the copper disc 1. The slot 4 is substantially wider than the control electrode.

Figure 6:
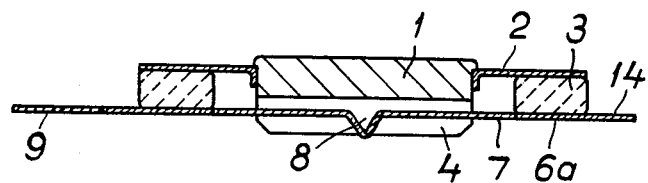
Figure 7:
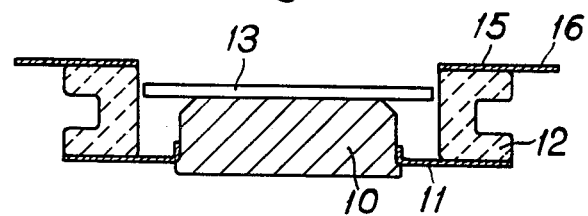
Figure 8:
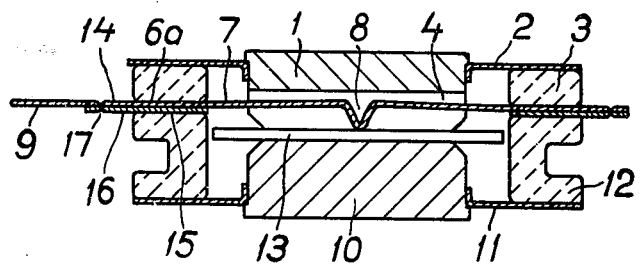
FIG. 8 shows a semiconductor device according to the invention composed of the parts shown in FIGS. 6 and 7. All figures except FIG. 3 show cross-sections of the respective part or device.

In the semiconductor device shown in FIGS. 6–8, the designations from FIGS. 1–5 have been maintained for the parts to which there are counterparts in the last-mentioned figures. The parts 1, 2 and 3 and also the parts 10, 11 and 12 are joined to each other in a manner indicated in connection with the description of FIGS. 1–5. The metal ring 6a between the rings of insulating material has a greater width in the device according to FIGS. 6–8 than in the device previously described so that it is provided with a portion 14 projecting outside the ring 3 and extending around the whole periphery. As is particularly clear from FIG. 7, a ring 15 which may be of the same material as in the part 6 (6a) is attached to the ring 12, said ring 15 having a portion 16 extending outside the ring 12 along its whole periphery. The metal rings 6a and 15 are secured to the rings 3 and 12 of insulating material in the same way as described previously for the metal ring 6. The joining together of the two parts shown in FIGS. 6 and 7 into a semiconductor device according to FIG. 8 is preformed by cold-press welding or other welding or soldering of the parts 14 and 16, thus obtaining a peripheral weld joint or solder joint 17. When the parts have been joined together the contact part 8 is held effectively pressed against the semiconductor disc by spring pressure.

The semiconductor devices according to FIGS. 5 and 8 may be provided with cooling bodies in a conventional manner, making contact with one or both of the sides 1 and 10. It is suitable to make use of the cooling bodies as connecting conductors for electric current.

I claim:

1. A semiconductor device comprising a semiconductor disc, a box having a bottom member and a lid member, said members being formed of a metallic material and each being in electrical contact with one side of the semiconductor disc, two rings of rigid insulating material to which said members are secured, a metal ring between and secured to said rings, and a control electrode secured at its ends to said metal ring and extending substantially diametrically thereacross, said control electrode having a projecting contact part in engagement with one side of the semiconductor disc and of such height as to be held by the control electrode in pressure contact with such side.

2. A semiconductor as claimed in claim 1, in which said control electrode is bent out of the plane of the metal ring on the side away from the semiconductor disc by the engagement of said projecting contact point with the side of the disc.

3. A semiconductor device as claimed in claim 1, in which the metal ring and the control electrode are formed of an integral piece of sheet metal.

* * * * *